(12) United States Patent
Huo

(10) Patent No.: US 12,176,045 B2
(45) Date of Patent: Dec. 24, 2024

(54) TECHNIQUES TO RETIRE UNRELIABLE BLOCKS

(71) Applicant: Micron Technology, Inc., Boise, ID (US)

(72) Inventor: Binbin Huo, Taufkirchen (DE)

(73) Assignee: Micron Technology, Inc., Boise, ID (US)

( * ) Notice: Subject to any disclaimer, the term of this patent is extended or adjusted under 35 U.S.C. 154(b) by 316 days.

(21) Appl. No.: 17/659,402

(22) Filed: Apr. 15, 2022

(65) Prior Publication Data

US 2023/0335204 A1 Oct. 19, 2023

(51) Int. Cl.
*G11C 16/34* (2006.01)
*G11C 16/16* (2006.01)
*G11C 16/26* (2006.01)

(52) U.S. Cl.
CPC .......... *G11C 16/3445* (2013.01); *G11C 16/16* (2013.01); *G11C 16/26* (2013.01); *G11C 16/349* (2013.01)

(58) Field of Classification Search
CPC ..... G11C 16/3445; G11C 16/16; G11C 16/26; G11C 16/349
USPC ........................ 365/185.22, 185.25
See application file for complete search history.

(56) References Cited

U.S. PATENT DOCUMENTS

| | | | | |
|---|---|---|---|---|
| 5,485,595 A * | 1/1996 | Assar | .................. | G06F 3/0601 |
| | | | | 365/185.11 |
| 8,717,826 B1 * | 5/2014 | Gurgi | .................. | G11C 16/349 |
| | | | | 365/185.24 |
| 2009/0154264 A1 * | 6/2009 | Kux | .................. | G11C 16/3495 |
| | | | | 365/201 |
| 2009/0172248 A1 * | 7/2009 | You | .................. | G06F 12/0246 |
| | | | | 711/E12.008 |
| 2010/0064096 A1 * | 3/2010 | Weingarten | ......... | G06F 12/0246 |
| | | | | 711/170 |
| 2010/0064111 A1 * | 3/2010 | Kunimatsu | ......... | G06F 12/0804 |
| | | | | 711/E12.001 |
| 2010/0122018 A1 * | 5/2010 | Kawaguchi | ......... | G06F 12/0246 |
| | | | | 711/E12.001 |
| 2011/0252289 A1 * | 10/2011 | Patapoutian | .......... | H03M 13/29 |
| | | | | 714/763 |
| 2012/0079174 A1 * | 3/2012 | Nellans | ............. | G11C 11/40615 |
| | | | | 711/E12.008 |
| 2013/0232289 A1 * | 9/2013 | Zhong | ................ | G11C 16/3495 |
| | | | | 711/102 |
| 2013/0311703 A1 * | 11/2013 | Cheng | ................. | G06F 12/0246 |
| | | | | 711/E12.008 |
| 2013/0326284 A1 * | 12/2013 | Losh | .................. | G06F 11/2053 |
| | | | | 714/47.2 |
| 2014/0019669 A1 * | 1/2014 | Nan | .................... | G06F 12/0246 |
| | | | | 711/E12.008 |

(Continued)

FOREIGN PATENT DOCUMENTS

WO WO-2012170848 A1 * 12/2012 ......... G06F 12/0246

*Primary Examiner* — Michael T Tran
(74) *Attorney, Agent, or Firm* — Holland & Hart LLP

(57) ABSTRACT

Methods, systems, and devices for techniques to retire unreliable blocks are described. A memory system may receive a request for information about a quantity of erase operations performed on a block of the memory system. Based on the request, the memory system may determine the quantity of erase operations performed on the block and transmit an indication of the quantity of erase operations performed on the block.

17 Claims, 8 Drawing Sheets

(56) References Cited

U.S. PATENT DOCUMENTS

| | | | |
|---|---|---|---|
| 2019/0179741 A1* | 6/2019 | Liu .......................... | G06F 3/064 |
| 2019/0212936 A1* | 7/2019 | Lee ........................ | G06F 3/0608 |
| 2021/0405888 A1* | 12/2021 | Park .................... | G06F 11/1048 |
| 2022/0050594 A1* | 2/2022 | Kim ........................ | G06F 3/064 |
| 2022/0051739 A1* | 2/2022 | Hwang .................. | G11C 16/30 |
| 2022/0147252 A1* | 5/2022 | Liu ........................ | G06F 9/4401 |
| 2022/0188177 A1* | 6/2022 | Lee ........................ | G11C 16/10 |

* cited by examiner

TECHNIQUES TO RETIRE UNRELIABLE BLOCKS

FIELD OF TECHNOLOGY

The following relates to one or more systems for memory, including techniques to retire unreliable blocks.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not- or (NOR) and not- and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

A memory system may include multiple memory blocks that the memory system uses to store information. To write new data to a block that has already been written, the memory system may move the existing data in the block to a new block (a process that may be referred to as garbage collection) and then perform an erase operation on the block to prepare it for the new data. Over time, the cumulative effects of erase operations may negatively impact the block, rendering the block unreliable. For example, data stored in an unreliable block may be corrupted, resulting in one or more uncorrectable errors. To identify unreliable blocks, a host system that writes data to a block may read the data back and perform error detection. If the read data has a threshold quantity of uncorrectable errors, the host system may determine that the block is unreliable for storing information and retire the block, (e.g., add the block to an "avoid" list) to prevent future use of the block. But reading data and performing error detection may increase latency and overhead for various operations requested by a host system.

According to the techniques described herein, a host system and a memory system may improve system performance by working together to retire unreliable blocks based on the quantity of erase operations performed on the blocks. For example, the memory system may keep track of the quantity of erase operations performed on a block. After performing an erase operation on the block the memory system may increment the value of an erase counter for the block and send an indication of the value of the erase counter to the host system. If the value of the erase counter satisfies a threshold, the host system may retire the block for subsequent write operations; otherwise, the host system may continue to use the block. Thus, the system may efficiently identify and retire unreliable blocks.

Figure 1:
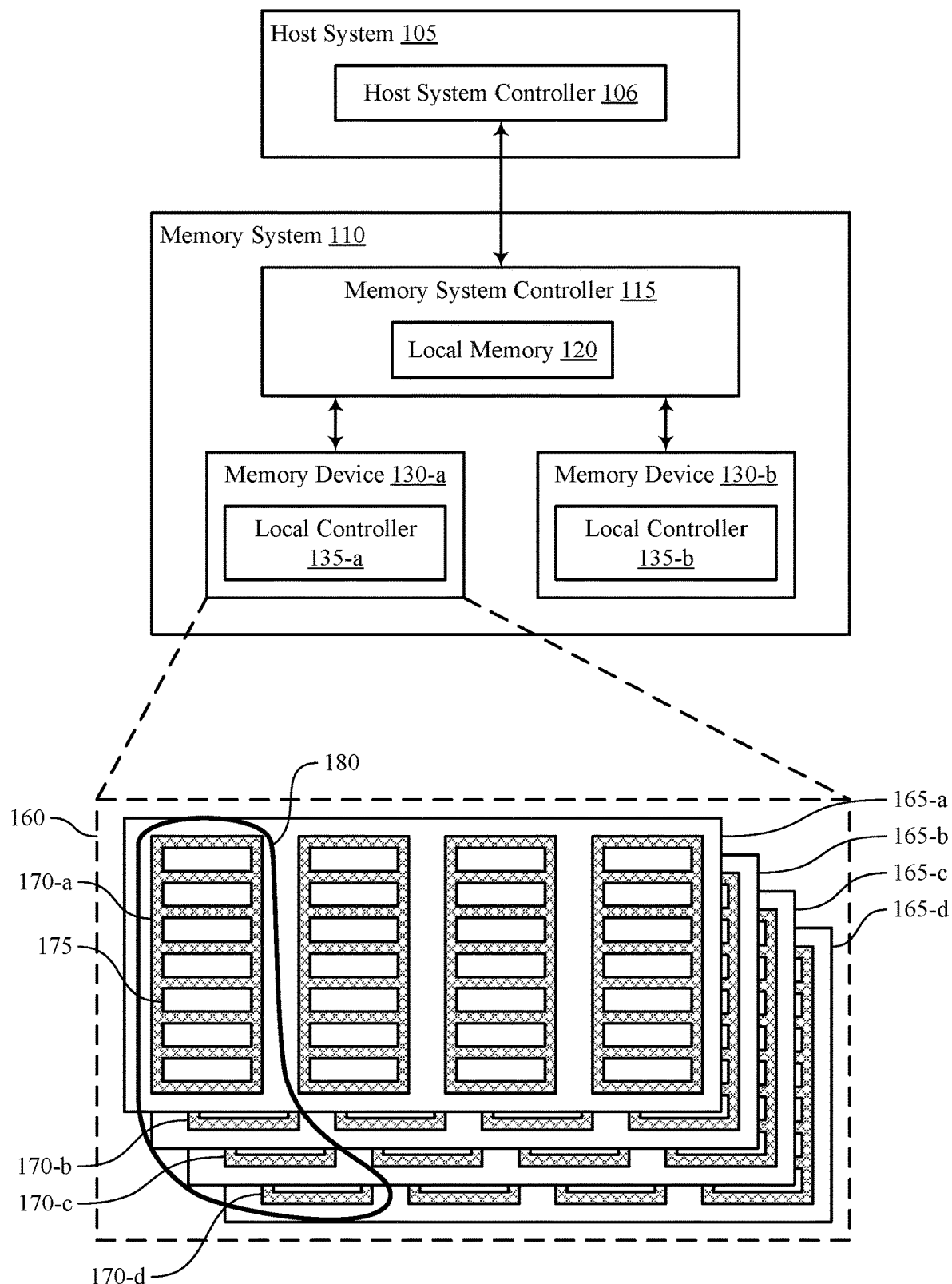
FIG. 1 illustrates an example of a system that supports techniques to retire unreliable blocks in accordance with examples as disclosed herein.
Figure 2:
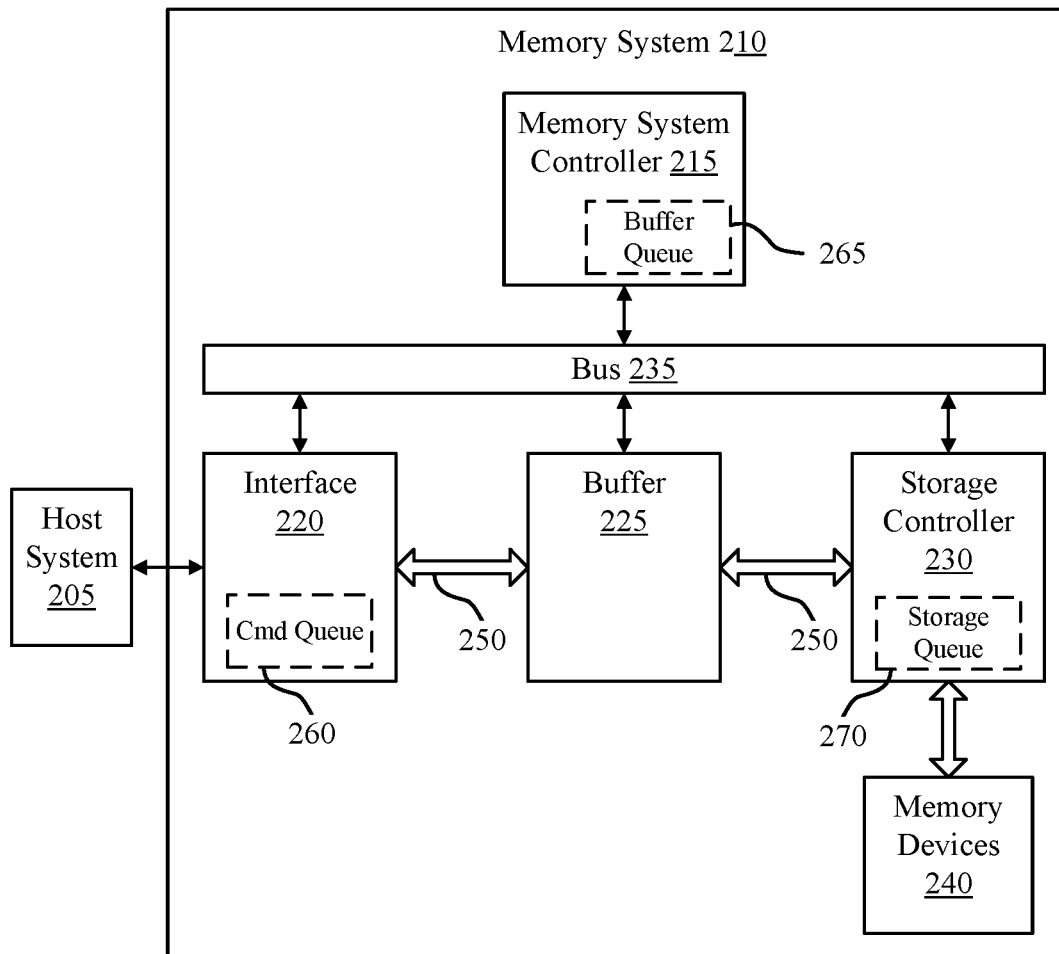
FIG. 2 illustrates an example of a system that supports techniques to retire unreliable blocks in accordance with examples as disclosed herein.

Features of the disclosure are initially described in the context of systems, devices, and circuits with reference to FIGS. 1 through 2. Features of the disclosure are described in the context of a system and a process flow with reference to FIGS. 3 and 4. These and other features of the disclosure are further illustrated by and described in the context of apparatus diagrams and flowcharts that relate to techniques to retire unreliable blocks with reference to FIGS. 5-8.

FIG. 1 illustrates an example of a system 100 that supports techniques to retire unreliable blocks in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer).

Each die 160 may include one or more planes 165, and each plane 165 may include a respective set of blocks 170, where each block 170 may include a respective set of pages 175, and each page 175 may include a set of memory cells.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The host system controller 106 or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by host system controller 106, the local controller 135, or memory system controller 115.

In some cases, L2P mapping tables may be maintained and data may be marked as valid or invalid at the page level of granularity, and a page 175 may contain valid data, invalid data, or no data. Invalid data may be data that is outdated due to a more recent or updated version of the data being stored in a different page 175 of the memory device 130. Invalid data may have been previously programmed to the invalid page 175 but may no longer be associated with a valid logical address, such as a logical address referenced by the host system 105. Valid data may be the most recent version of such data being stored on the memory device 130. A page 175 that includes no data may be a page 175 that has never been written to or that has been erased.

In some cases, a memory system controller 115 or a local controller 135 may perform operations (e.g., as part of one or more media management algorithms or as instructed by the host system 105) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked (e.g., by the host system 205) to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system. In other cases, the memory system 110 may be a non-managed NAND system in which the memory system 110 has reduced processing capabilities relative to managed NAND systems. In a non-managed NAND system, the host system 105 may manage the memory devices 130 and may instruct the memory system controller 115 to perform the operations described herein. In such a scenario, the memory system controller 115 may be examples of logic that implements commands from the host system controller 106.

As noted, the memory system 110 may perform data movement operations, such as garbage collection operations, to consolidate valid data and free up blocks for writing. As part of a data movement operation, the memory system 110 may read data (e.g., valid data) from one or more origin blocks and write the data to one or more target blocks. After performing a data movement procedure on a block, the memory system 110 may (e.g., during an idle time) perform an erase operation on the block.

Over time, a block may become unreliable for storing information due to the cumulative effects of erase operations. For example, a block may become damaged so that a read operation on the block results in uncorrectable errors in the data. To help the host system 105 detect an unreliable block, the memory system 110 may record the quantity of erase operations performed on the block. In response to a request from the host system 105, the memory system 110 may transmit an indication of the quantity of erase operations. The host system 105 may compare the quantity of erase operations to a threshold quantity for the block and, if the quantity of erase operations satisfies (e.g., is greater than or equal to) the threshold quantity, the host system 105 may identify the block as an unreliable block and retire the block.

The term "unreliable block" may refer to a block that experiences a threshold quantity of errors (e.g., uncorrectable errors) during an access operation (e.g., a read operation) or a block that has been subject to a threshold quantity of erase operations.

The system 100 may include any quantity of non-transitory computer readable media that support techniques to retire unreliable blocks. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

FIG. 2 illustrates an example of a system 200 that supports techniques to retire unreliable blocks in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively. In some examples, the system 200 may be an example of a non-managed NAND system in which the host system is responsible for managing the memory devices 240 and in which the memory system controller 215 is responsible for parsing and executing commands from the host system.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point, other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, upon completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation.

However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. Upon receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received based on the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

Upon the determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed herein. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

In some examples, the memory system 210 may include high density memory cells (e.g., multiple-level cells (MLCs)) and low density memory cells (e.g., single-level cells (SLCs)). High density memory cells may be capable of storing more data than low density memory cells (because the high density memory cells may use more levels than the low density memory cells) but may be less reliable than low density memory cells (because the difference between levels of high density memory cells may be smaller, and therefore more impacted by small variations, relative to low density memory cells). Examples of MLCs include: bi-level memory cells (BLCs), which may be configured to each store two bits (e.g., using four levels), tri-level memory cells (TLCs), which may be configured to each store three levels (e.g., using eight levels), and quad-level memory cells (QLCs), which may be configured to each store four levels (e.g., using sixteen levels). In general, a memory cell that is configured to store n bits may be configured to support $2^n$ levels.

High density memory cells (e.g., MLCs) may wear out differently than low density memory cells (e.g., SLCs). For example, QLCs may be capable of withstanding fewer erase operations than SLCs. To illustrate, QLCs may become unreliable after x erase operations, whereas SLCs may become unreliable after y erase operations, where y>x. So, the quantity of erase operations to render a block unreliable (which may be referred to as the retirement threshold $Th_{RET}$) may vary with the quantity of bits the memory cells in the block are configured to store. The retirement threshold for a block may additionally or alternatively refer to the total quantity of erase operations permitted for the block.

According to the techniques described herein, the system 200 may be configured to detect unreliable blocks by monitoring the quantity of erase operations performed on the blocks. For example, the memory system 210 may maintain an erase counter for a block of the memory device 240. The value of the erase counter may indicate the quantity of times an erase operation has been performed on the block. In response to a trigger (e.g., a request from the host system 205), the memory system 210 may indicate the value of the erase counter to the host system 205. The host system 205 may compare the value of the erase counter to the retirement threshold for the block (which may be based on the type of memory cells in the block) to determine the reliability status of the block. If the value of the erase counter satisfies the retirement threshold (e.g., if the value is greater than or equal to the retirement threshold), the host system 205 may determine that the block is unreliable and retire the block by adding the block to a list of blocks to be avoided for access operations.

Using erase counters may allow the memory system 210, which may be a non-managed NAND, to more efficiently detect unreliable blocks compared to other techniques, which may involve the host system 205 performing time consuming operations such as writing data to the blocks, reading the data from the blocks, and performing error analysis on the read data.

Figure 3:
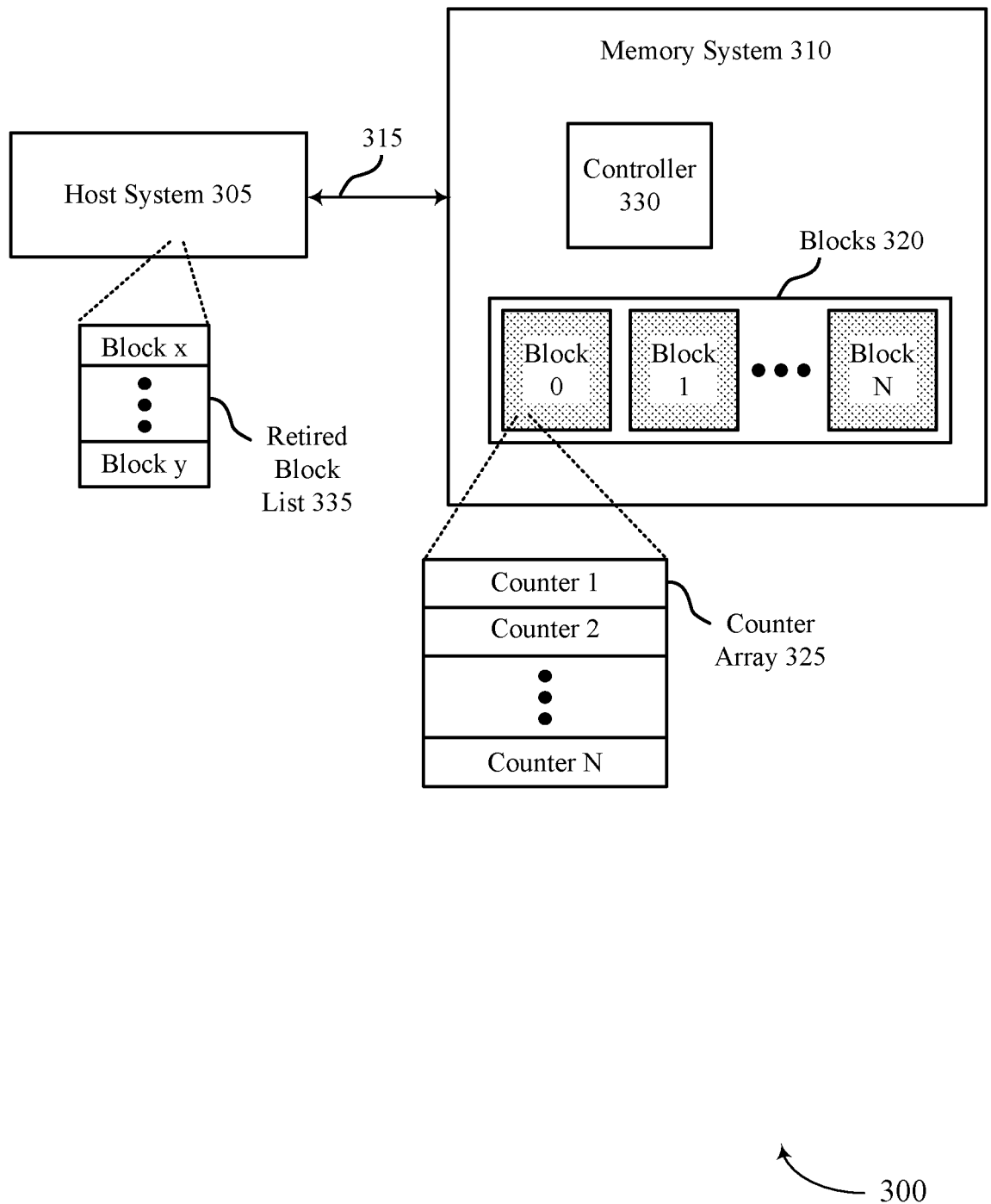
FIG. 3 illustrates an example of a system that supports techniques to retire unreliable blocks in accordance with examples as disclosed herein.

FIG. 3 illustrates an example of a system 300 that supports techniques to retire unreliable blocks in accordance with examples as disclosed herein. The system 300 may include a host system 305 and a memory system 310, which may be examples of host system and memory system, respectively, as described with reference to FIGS. 1 and 2. The host system 305 and the memory system 310 may communicate information (e.g., data, control information, erase counter values) over an interface 315, which may be coupled with the host system 305 and the memory system 310. Together, the host system 305 and the memory system 310 may employ the techniques described herein to efficiently retire unreliable blocks in the memory system 310.

The memory system 310 may include blocks 320, which may be examples of blocks in one or more memory dies of the memory system 310. The blocks 320 may include SLC blocks, which may be blocks that includes SLCs, and/or MLC blocks, which may be blocks that include MLCs. As noted, the SLC blocks may have different retirement thresholds than the QLC blocks.

The memory system 310 maintain a counter array 325 that includes a set of erase counters for the blocks 320. For example, the counter array 325 may include an erase counter (e.g., counter 1) for block 1, an erase counter (e.g., block 2) for block 2, and so on and so forth. The erase counter for a block may be configured to store a value that indicates the quantity of times an erase operation has been performed on the block. For example, if y erase operations have been performed on a block, the counter for the block may indicate the value y. In some examples, counter array 325 may be included in a block of the blocks 320. For instance, the counter array 325 may be included in block 0. If the counter array 325 is included in a block, the memory system 310 may designate that block a read-only block (which refers to a block that permits read operations but may not permit write operations) and may indicate the designation to the host system 305 so that the block is not accidentally over-written. In some examples, the block selected for including the counter array 325 may be a highly reliable or enhanced block (e.g., an SLC block) relative to other blocks in the memory system 310.

In some examples, the memory system 310 may also include (e.g., in block 0) a retirement threshold array that is configured to store the retirement thresholds for the blocks 320. The retirement thresholds may be stored on a per-block basis or on a block type-basis (where the block type refers to the quantity of levels the memory cells in a block are configured to store). In some examples, the retirement threshold may be preconfigured (e.g., defined in a device-specific profile descriptor, which may be set by a manufacturer).

The controller 330 may be configured to facilitate access operations (e.g., read operations, write operations, erase operations) that are performed on the block 320 and may also be configured to control the counter array 325. For example, the controller 330 may facilitate the performance of an erase operation on block 1 and, based on (e.g., in response to) performing the erase operation on block 1, may increment the value for block 1 in counter 1 to reflect performance of the erase operation.

The memory system 310 may report the counter values for blocks to the host system 305 so that the host system 305 can retire unreliable blocks. The memory system 310 may report the counter value for a block autonomously (e.g., after performing an erase operation on the block) or in response to a request from the host system 305. The host system 305 may compare the counter value for a block to the retirement threshold for that block and, if the counter value satisfies the retirement threshold, may retire the block by adding the block to a list (e.g., retired block list 335) of blocks that are avoided for access operations. The retirement threshold for a block may be stored at the host system 305 or indicated to the host system 305 by the memory system 310.

As an example, the memory system 310 may perform an erase operation on block 1. For example, the memory system 310 may perform an erase operation on block 1 after perform performing a data movement operation (e.g., a garbage collection operation) on block 1 in which data from block 1 is moved to another block. Based on performing the erase operation on block 1, the memory system 310 may (e.g., via the controller 330) increment the value of counter 1 to reflect that the erase operation was performed. For instance, if the value of counter 1 is i before the erase operation is performed, the memory system 310 may increment the value to i+1. The memory system 310 may then send an indication of the counter value for block 1 to the host system 305. In some examples, the memory system 310 may also send an indication of the retirement threshold for block 1 or an indication of the quantity of levels the memory cells in block 1 are configured to store.

The host system 305 may receive the counter value for block 1 and determine the retirement threshold against which to compare the counter value. If the host system 305 stores retirement thresholds on a per-block basis, the host system 305 may determine the retirement threshold for block 1 based on the index or address of block 1, which may be indicated by the memory system 310 along with the counter value. If the host system 305 stores retirement thresholds on a block-type basis, the host system 305 may determine the retirement threshold for block 1 based on the block type for block 1, which may be indicated by the memory system 310 along with the counter value. If the memory system 310 stores the retirement thresholds, the host system 305 may determine the retirement threshold for block 1 based on an indication of the retirement threshold received from the memory system 310.

After determining the retirement threshold for block 1, the host system 305 may compare the counter value for block 1 to the retirement threshold for block 1 so that the host system 305 can determine the reliability status of block 1. If the counter value does not satisfy the retirement threshold, the host system 305 may determine that block 1 is reliable for storing information and may continue to target block 1 for access operations (e.g., write operations, read operations). If the counter value satisfies the retirement threshold (e.g., is equal to, is greater than), the host system may determine that block 1 is unreliable for storing information and may retire block 1 by adding block 1 to the retired block list. Unlike other techniques in which the host system 305 determines the reliability status of a block by writing and reading the block, the techniques described herein may have reduced signaling and consume less bandwidth over the interface 315.

Thus, the host system 305 and the memory system 310 may work together to efficiently retire unreliable blocks in the memory system 310.

Figure 4:
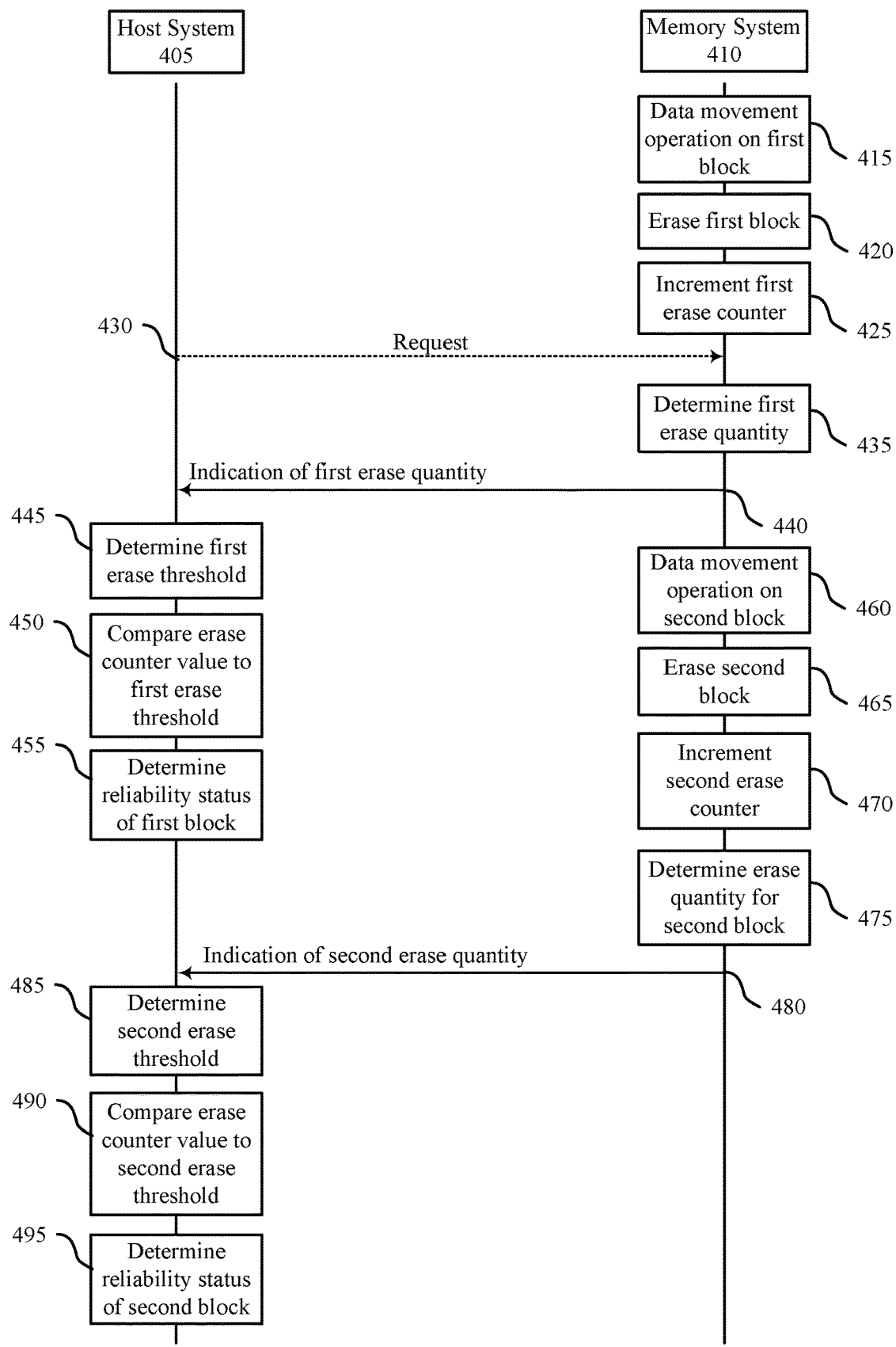
FIG. 4 illustrates an example of a process flow that supports techniques to retire unreliable blocks in accordance with examples as disclosed herein.

FIG. 4 illustrates an example of a process flow 400 that supports techniques to retire unreliable blocks in accordance with examples as disclosed herein. The process flow 400 may be implemented by a host system 405 and a memory system 410. The host system 405 may be an example of a host system 105 as described with reference to FIG. 1 or a host system 305 as described with reference to FIG. 3. The memory system 410 may be an example of a memory system 110 as described with reference to FIG. 1 or a memory system 310 as described with reference to FIG. 3. In some examples, the host system 405 and the memory system 410 may be included in a system (e.g., the system 300) as described herein. By implementing the process flow 400, the system may efficiently detect and retire unreliable blocks, which may improve system performance. Although described with reference to two blocks, the techniques described herein may be used to determine the reliability status for any quantity of blocks.

Aspects of the process flow 400 may be implemented by one or more controllers, among other components. Additionally or alternatively, aspects of the process flow 400 may be implemented as instructions stored in memory (e.g., firmware stored in a memory coupled with the memory system 300). For example, the instructions, if executed by a controller (e.g., the memory system controller 115, a local controller 135), may cause the controller to perform the operations of the process flow 400.

At 415, the memory system 410 may perform a data movement operation (e.g., a garbage collection operation) on a first block of a memory array. For instance, the memory system 410 may read data from the first block and write the data to another block of the blocks 320. At 420, the memory system 410 may perform an erase operation on the first block. The memory system 410 may perform the erase operation on the first block based on performing the data movement operation on the first block.

At 425, the memory system 410 may increment the value of a first counter based on performing the erase operation at 420. The first counter may be associated with the first block and may be configured to indicate the quantity of erase operations performed on the first block. At 430, the host system 405 may transmit, and the memory system 410 may receive, a request for erase information for the first block. Alternatively, the host system 405 may transmit, and the memory system 410 may receive, a write command for the first block.

At 435, the memory system 410 may determine a first quantity of erase operations that have been performed on the first block. The memory system 410 may determine the first quantity based on the value of the first counter. For instance, the first quantity may be equal to the value of the first counter. The memory system 410 may determine the first quantity based on (e.g., in response to) the request (or write command) received at 430. In some examples, the memory system 410 may also determine the type of the first block, the retirement threshold for first block, or both.

At 440, the memory system 410 may transmit an indication of the first quantity of erase operations to the host system 405. The memory system 410 may transmit the indication based on (e.g., in response to) the request (or write command) received at 430. In some examples, the memory system 410 may also transmit an indication of type of the first block, the retirement threshold for the first block, or both.

At 445, the host system 405 may determine a first erase threshold for the first block. The first erase threshold may be the retirement threshold for the first block and may represent a first total quantity of erase operations permitted for the first block. The host system 405 may determine the first erase threshold based on (e.g., in response to) the indication of the first quantity received at 440. In some examples, the host system 405 may determine the first erase threshold based on an indication of the retirement threshold received from the memory system 405. Alternatively, the host system 405 may determine the first erase threshold based on the type of the first block. For example, if the first block is an SLC block configured to store a single bit per memory cell, the erase threshold may be determined based on the retirement threshold for SLC blocks. If the first block is an MLC block configured to store multiple bits per memory cell, the erase threshold may be determined based on the retirement threshold for MLC blocks, which may be different (e.g., lower than) than the retirement threshold for SLC blocks.

At 450, the host system 405 may compare the first quantity of erase operations for the first block to the first erase threshold for the first block. At 455, the host system 405 may determine a reliability status for the first block based on the comparison of the first quantity of erase operations for the first block to the first erase threshold for the first block. If the first quantity of erase operations does not satisfy (e.g., is less than) the first erase threshold, the host system 405 may determine that the first block is reliable for storing information and may refrain from adding the first block to the retirement list. In such a scenario, the host system 405 may continue to use the first block for access operations. If the first quantity of erase operations satisfies (e.g., is equal to, is greater than) the first erase threshold, the host system 405 may determine that the first block is unreliable for storing information and may add the first block to the retirement list.

At 460, the memory system 410 may perform a data movement operation (e.g., a garbage collection operation) on a second block of a memory array. For instance, the memory system 410 may read data from the second block and write the data to another block of the blocks 320. At 465, the memory system 410 may perform an erase operation on the second block. The memory system 410 may perform the erase operation on the second block based on performing the data movement operation on the second block.

At 470, the memory system 410 may increment the value of a second counter based on performing the erase operation at 420. The second counter may be associated with the second block and may be configured to indicate the quantity of erase operations performed on the second block.

At 475, the memory system 410 may determine a second quantity of erase operations that have been performed on the second block. The memory system 410 may determine the second quantity based on the value of the second counter. For instance, the second quantity may be equal to the value of the second counter. The memory system 410 may determine the second quantity based on (e.g., in response to) the request (or write command) received at 430 or based on another request (or write command) received after 430. In some examples, the memory system 410 may also determine the type of the second block, the retirement threshold for first second, or both. The second block may be a different type than the first block, and thus may have a different retirement threshold than the first block.

At 480, the memory system 410 may transmit an indication of the second quantity of erase operations to the host system 405. The memory system 410 may transmit the indication based on (e.g., in response to) the request (or write command) received at 430 or based on another request (or write command) received after 430. In some examples, the memory system 410 may also transmit an indication of type of the second block, the retirement threshold for the second block, or both.

At 485, the host system 405 may determine a second erase threshold (e.g., the retirement threshold) for the second block. The second erase threshold may be the retirement threshold for the second block and may represent a second total quantity of erase operations permitted for the second block. The host system 405 may determine the second erase threshold based on (e.g., in response to) the indication of the second quantity received at 480. In some examples, the host system 405 may determine the second erase threshold based on an indication of the retirement threshold received from the memory system 405. Alternatively, the host system 405 may determine the second erase threshold based on the type of the second block.

At 490, the host system 405 may compare the second quantity of erase operations for the second block to the second erase threshold for the second block. At 495, the host system 405 may determine a reliability status for the second block based on the comparison of the second quantity of erase operations for the second block to the second erase threshold for the second block. If the second quantity of erase operations does not satisfy (e.g., is less than) the second erase threshold, the host system 405 may determine that the second block is reliable for storing information and may refrain from adding the second block to the retirement list. In such a scenario, the host system 405 may continue to use the second block for access operations. If the second quantity of erase operations satisfies (e.g., is equal to, is greater than) the second erase threshold, the host system 405 may determine that the second block is unreliable for storing information and may add the second block to the retirement list.

Thus, the system may efficiently detect and retire unreliable blocks, which may improve system performance. Alternative examples of the foregoing may be implemented, where some operations partially overlap, are performed in a different order than described, are performed in parallel, or are not performed at all. In some cases, operations may include additional features not mentioned herein, or further operations may be added. Additionally, some operations may be performed multiple times or some combinations of operations may repeat or cycle.

Figure 5:
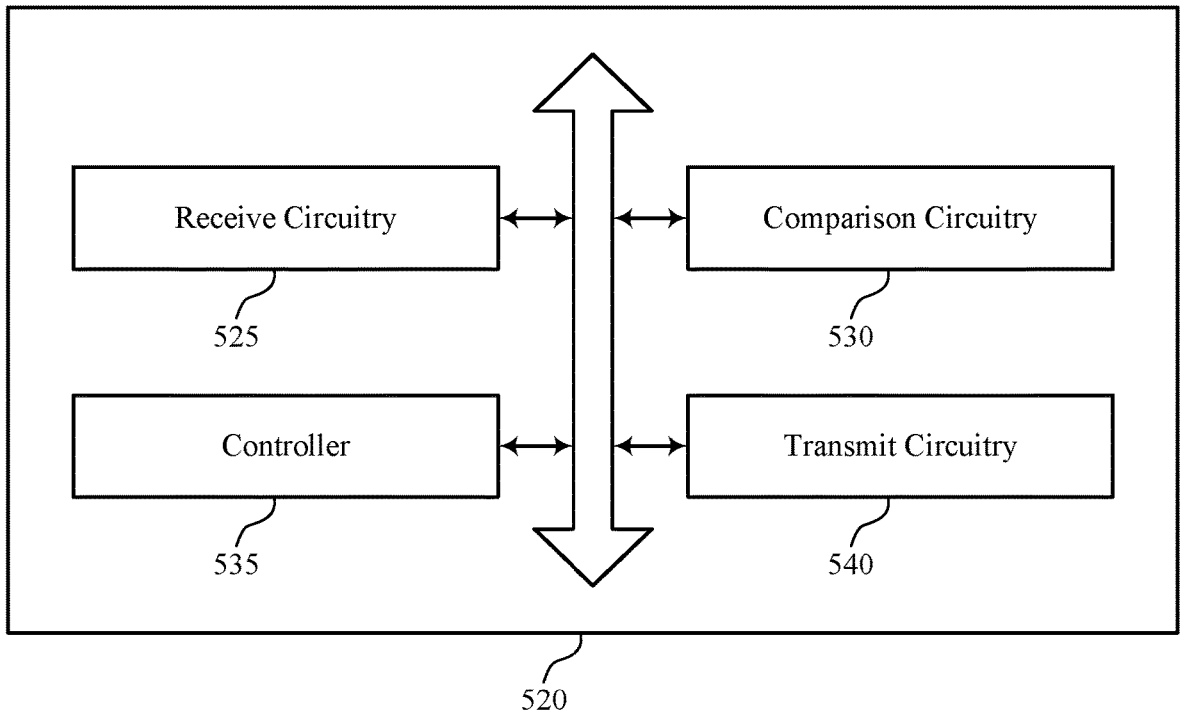
FIG. 5 shows a block diagram of a host system that supports techniques to retire unreliable blocks in accordance with examples as disclosed herein.

FIG. 5 shows a block diagram 500 of a host system 520 that supports techniques to retire unreliable blocks in accordance with examples as disclosed herein. The host system 520 may be an example of aspects of a host system as described with reference to FIGS. 1 through 4. The host system 520, or various components thereof, may be an example of means for performing various aspects of techniques to retire unreliable blocks as described herein. For example, the host system 520 may include a receive circuitry 525, a comparison circuitry 530, a controller 535, a transmit circuitry 540, or any combination thereof. Each of these components may communicate, directly or indirectly, with one another (e.g., via one or more buses).

The receive circuitry 525 may be configured as or otherwise support a means for receiving, at a host system, an indication of a quantity of erase operations performed on a block of a memory system. The comparison circuitry 530 may be configured as or otherwise support a means for comparing the quantity of erase operations performed on the block with a threshold quantity. The controller 535 may be configured as or otherwise support a means for determining a reliability status of the block based at least in part on comparing the quantity of erase operations performed on the block with the threshold quantity. In some examples, the controller 535 may be configured as or otherwise support a means for retiring the block based at least in part on the reliability status.

In some examples, to support determining the reliability status, the controller 535 may be configured as or otherwise support a means for determining that the block is unreliable for storing information, and where retiring the block includes. In some examples, to support determining the reliability status, the controller 535 may be configured as or otherwise support a means for adding the block to a list of blocks avoided for access operations.

In some examples, the transmit circuitry 540 may be configured as or otherwise support a means for transmitting, from the host system, a request for information about the quantity of erase operations performed on the block of the memory system, where the indication is received based at least in part on transmitting the request.

In some examples, the controller 535 may be configured as or otherwise support a means for determining that the quantity of erase operations performed on the block satisfies the threshold quantity, where determining the reliability status of the block includes. In some examples, the controller 535 may be configured as or otherwise support a means for determining that the block is unreliable for storing information, where the block is retired based at least in part on determining that the block is unreliable.

In some examples, the controller 535 may be configured as or otherwise support a means for determining a total quantity of erase operations permitted for the block. In some examples, the controller 535 may be configured as or otherwise support a means for selecting the threshold quantity based at least in part on the total quantity of erase operations.

In some examples, the controller 535 may be configured as or otherwise support a means for determining a quantity of bits the memory cells included in the block are configured to store, where the threshold quantity is selected based at least in part on the quantity of bits.

In some examples, the receive circuitry 525 may be configured as or otherwise support a means for receiving an indication of a second quantity of erase operations performed on a second block of the memory system. In some examples, the comparison circuitry 530 may be configured as or otherwise support a means for comparing the second quantity of erase operations performed on the second block with a second threshold quantity.

In some examples, the controller 535 may be configured as or otherwise support a means for determining a reliability status of the second block based at least in part on comparing the second quantity of erase operations performed on the second block with the second threshold quantity. In some examples, the controller 535 may be configured as or otherwise support a means for retiring the second block based at least in part on the reliability status of the second block. In some examples, the threshold quantity is equal to the second threshold quantity.

In some examples, the controller 535 may be configured as or otherwise support a means for determining a first total quantity of erase operations permitted for the block and a second total quantity of erase operations permitted for the second block different than the first total quantity of erase operations. In some examples, the controller 535 may be configured as or otherwise support a means for selecting the threshold quantity for the block as the first total quantity and selecting the second threshold quantity for the second block as the second total quantity.

Figure 6:
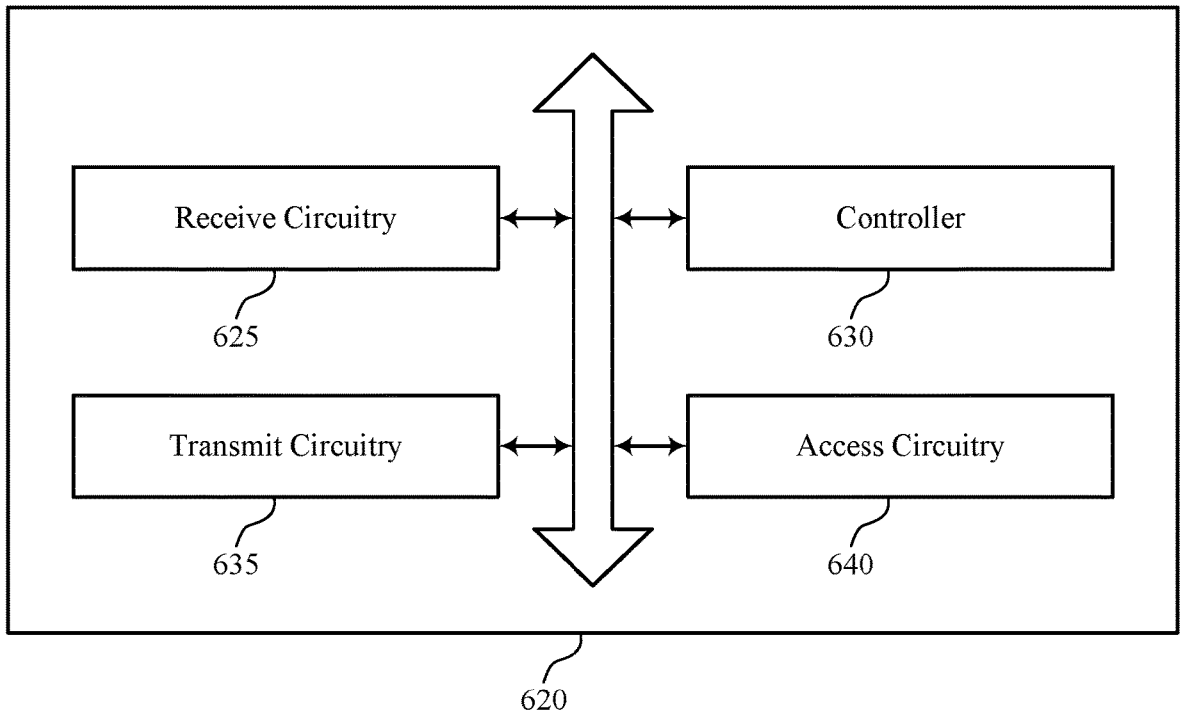
FIG. 6 shows a block diagram of a memory system that supports techniques to retire unreliable blocks in accordance with examples as disclosed herein.

FIG. 6 shows a block diagram 600 of a memory system 620 that supports techniques to retire unreliable blocks in accordance with examples as disclosed herein. The memory system 620 may be an example of aspects of a memory system as described with reference to FIGS. 1 through 4. The memory system 620, or various components thereof, may be an example of means for performing various aspects of techniques to retire unreliable blocks as described herein. For example, the memory system 620 may include a receive circuitry 625, a controller 630, a transmit circuitry 635, an access circuitry 640, or any combination thereof. Each of these components may communicate, directly or indirectly, with one another (e.g., via one or more buses).

The receive circuitry 625 may be configured as or otherwise support a means for receiving, at a memory system, a request for information about a quantity of erase operations performed on a block of the memory system. The controller 630 may be configured as or otherwise support a means for determining the quantity of erase operations performed on the block based at least in part on the request. The transmit circuitry 635 may be configured as or otherwise support a means for transmitting, to a host system, an indication of the quantity of erase operations performed on the block based at least in part on determining the quantity of erase operations.

In some examples, the access circuitry 640 may be configured as or otherwise support a means for performing an erase operation on the block of the memory system, where the quantity of erase operations is determined based at least in part on performing the erase operation.

In some examples, the access circuitry 640 may be configured as or otherwise support a means for performing a data movement operation in which a set of data in the block is moved to a second block, where the erase operation is performed based at least in part on performing the data movement operation.

In some examples, the controller 630 may be configured as or otherwise support a means for incrementing a value of a counter associated with the block based at least in part on performing the erase operation, where the quantity of erase operations transmitted to the host system is based at least in part on the value of the counter.

In some examples, the controller 630 may be configured as or otherwise support a means for determining, after transmitting the indication of the quantity, a second quantity of erase operations performed on a second block. In some examples, the transmit circuitry 635 may be configured as or otherwise support a means for transmitting, from the memory system, an indication of the second quantity of erase operations performed on the second block.

In some examples, the transmit circuitry 635 may be configured as or otherwise support a means for transmitting, based at least in part on the request, an indication of a total quantity of erase operations permitted for the block.

Figure 7:
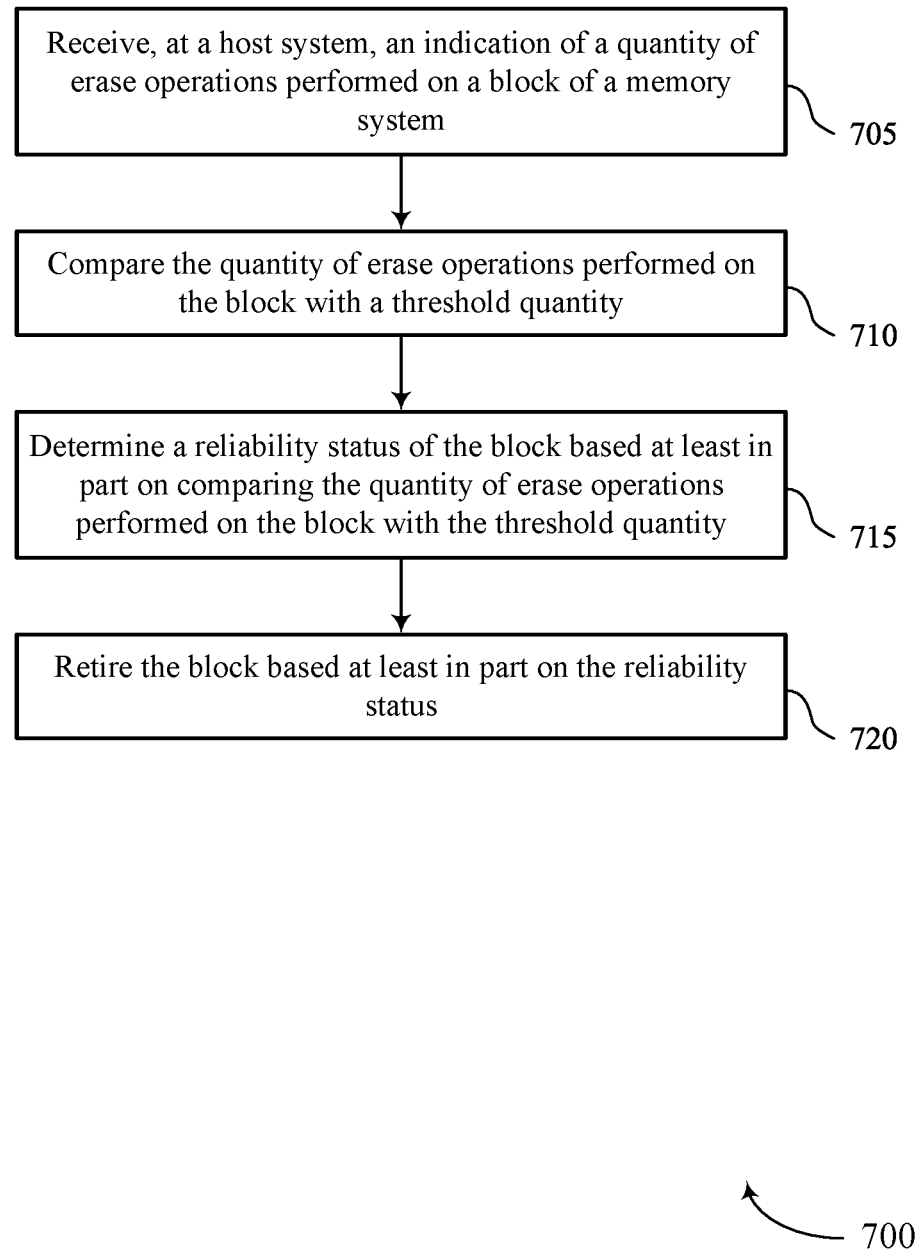
FIGS. 7 and 8 show flowcharts illustrating a method or methods that support techniques to retire unreliable blocks in accordance with examples as disclosed herein.

FIG. 7 shows a flowchart illustrating a method 700 that supports techniques to retire unreliable blocks in accordance with examples as disclosed herein. The operations of method 700 may be implemented by a host system or its components as described herein. For example, the operations of method 700 may be performed by a host system as described with reference to FIGS. 1 through 5. In some examples, a host system may execute a set of instructions to control the functional elements of the device to perform the described functions. Additionally, or alternatively, the host system may perform aspects of the described functions using special-purpose hardware.

At 705, the method may include receiving, at a host system, an indication of a quantity of erase operations performed on a block of a memory system. The operations of 705 may be performed in accordance with examples as disclosed herein. In some examples, aspects of the operations of 705 may be performed by a receive circuitry 525 as described with reference to FIG. 5.

At 710, the method may include comparing the quantity of erase operations performed on the block with a threshold quantity. The operations of 710 may be performed in accordance with examples as disclosed herein. In some examples, aspects of the operations of 710 may be performed by a comparison circuitry 530 as described with reference to FIG. 5.

At 715, the method may include determining a reliability status of the block based at least in part on comparing the quantity of erase operations performed on the block with the threshold quantity. The operations of 715 may be performed in accordance with examples as disclosed herein. In some examples, aspects of the operations of 715 may be performed by a controller 535 as described with reference to FIG. 5.

At 720, the method may include retiring the block based at least in part on the reliability status. The operations of 720 may be performed in accordance with examples as disclosed herein. In some examples, aspects of the operations of 720 may be performed by a controller 535 as described with reference to FIG. 5.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving, at a host system, an indication of a quantity of erase operations performed on a block of a memory system; comparing the quantity of erase operations performed on the block with a threshold quantity; determining a reliability status of the block based at least in part on comparing the quantity of erase operations performed on the block with the threshold quantity; and retiring the block based at least in part on the reliability status.

Aspect 2: The method, apparatus, or non-transitory computer-readable medium of aspect 1 where determining the reliability status includes operations, features, circuitry, logic, means, or instructions, or any combination thereof for determining that the block is unreliable for storing information, and where retiring the block includes and adding the block to a list of blocks avoided for access operations.

Aspect 3: The method, apparatus, or non-transitory computer-readable medium of any of aspects 1 through 2, further including operations, features, circuitry, logic, means, or instructions, or any combination thereof for transmitting, from the host system, a request for information about the quantity of erase operations performed on the block of the memory system, where the indication is received based at least in part on transmitting the request.

Aspect 4: The method, apparatus, or non-transitory computer-readable medium of any of aspects 1 through 3, further including operations, features, circuitry, logic, means, or instructions, or any combination thereof for determining that the quantity of erase operations performed on the block satisfies the threshold quantity, where determining the reliability status of the block includes and determining that the block is unreliable for storing information, where the block is retired based at least in part on determining that the block is unreliable.

Aspect 5: The method, apparatus, or non-transitory computer-readable medium of any of aspects 1 through 4, further including operations, features, circuitry, logic, means, or instructions, or any combination thereof for determining a total quantity of erase operations permitted for the block and selecting the threshold quantity based at least in part on the total quantity of erase operations.

Aspect 6: The method, apparatus, or non-transitory computer-readable medium of aspect 5, further including operations, features, circuitry, logic, means, or instructions, or any combination thereof for determining a quantity of bits the memory cells included in the block are configured to store, where the threshold quantity is selected based at least in part on the quantity of bits.

Aspect 7: The method, apparatus, or non-transitory computer-readable medium of any of aspects 1 through 6, further including operations, features, circuitry, logic, means, or instructions, or any combination thereof for receiving an indication of a second quantity of erase operations performed on a second block of the memory system and comparing the second quantity of erase operations performed on the second block with a second threshold quantity.

Aspect 8: The method, apparatus, or non-transitory computer-readable medium of aspect 7, further including operations, features, circuitry, logic, means, or instructions, or any combination thereof for determining a reliability status of the second block based at least in part on comparing the second quantity of erase operations performed on the second block with the second threshold quantity and retiring the second block based at least in part on the reliability status of the second block.

Aspect 9: The method, apparatus, or non-transitory computer-readable medium of any of aspects 7 through 8 where the threshold quantity is equal to the second threshold quantity.

Aspect 10: The method, apparatus, or non-transitory computer-readable medium of any of aspects 7 through 9, further including operations, features, circuitry, logic, means, or instructions, or any combination thereof for determining a first total quantity of erase operations permitted for the block and a second total quantity of erase operations permitted for the second block different than the first total quantity of erase operations and selecting the threshold quantity for the block as the first total quantity and selecting the second threshold quantity for the second block as the second total quantity.

Figure 8:
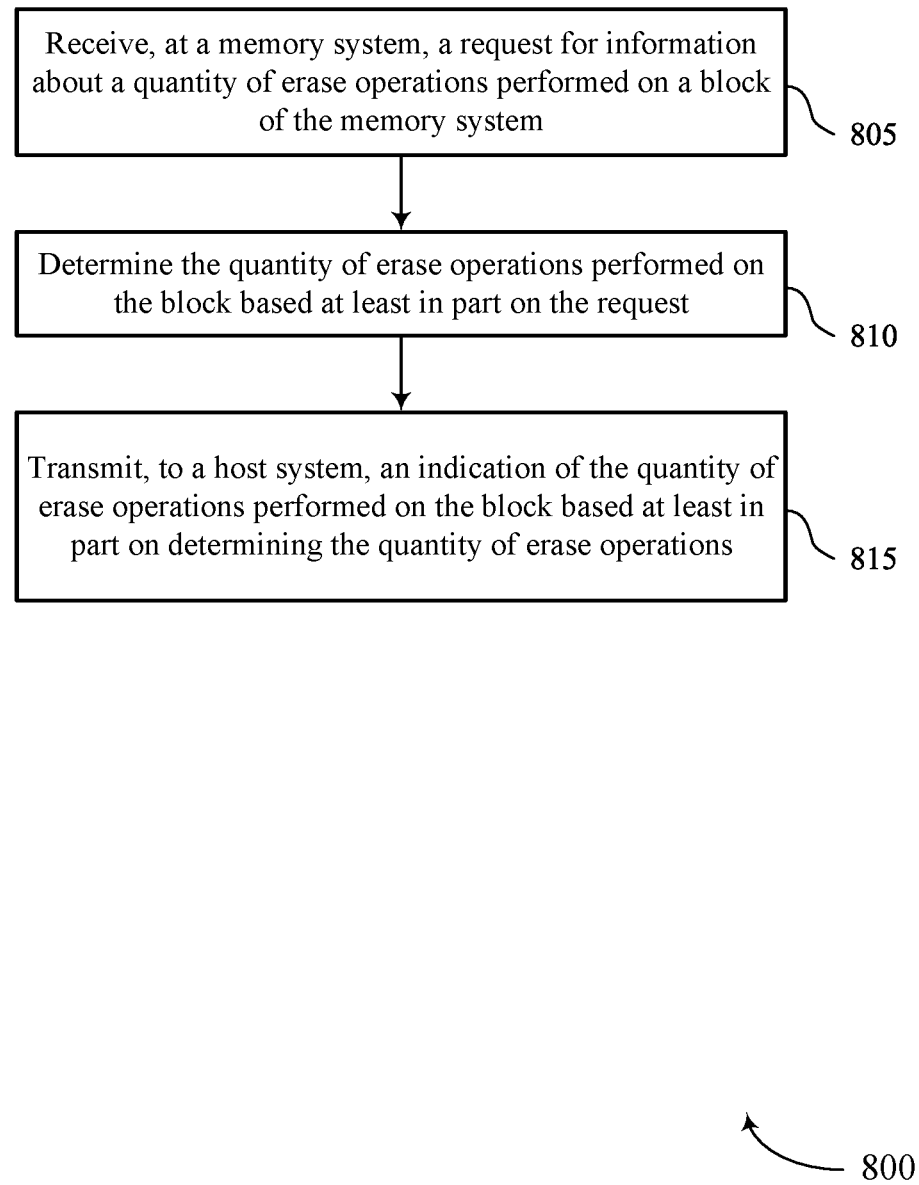

FIG. 8 shows a flowchart illustrating a method 800 that supports techniques to retire unreliable blocks in accordance with examples as disclosed herein. The operations of method 800 may be implemented by a memory system or its components as described herein. For example, the operations of method 800 may be performed by a memory system as described with reference to FIGS. 1 through 4 and 6. In some examples, a memory system may execute a set of instructions to control the functional elements of the device to perform the described functions. Additionally, or alternatively, the memory system may perform aspects of the described functions using special-purpose hardware.

At 805, the method may include receiving, at a memory system, a request for information about a quantity of erase operations performed on a block of the memory system. The operations of 805 may be performed in accordance with examples as disclosed herein. In some examples, aspects of the operations of 805 may be performed by a receive circuitry 625 as described with reference to FIG. 6.

At 810, the method may include determining the quantity of erase operations performed on the block based at least in part on the request. The operations of 810 may be performed in accordance with examples as disclosed herein. In some examples, aspects of the operations of 810 may be performed by a controller 630 as described with reference to FIG. 6.

At 815, the method may include transmitting, to a host system, an indication of the quantity of erase operations performed on the block based at least in part on determining the quantity of erase operations. The operations of 815 may be performed in accordance with examples as disclosed herein. In some examples, aspects of the operations of 815 may be performed by a transmit circuitry 635 as described with reference to FIG. 6.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 11: A method, apparatus, or non-transitory computer-readable medium including operations, features, circuitry, logic, means, or instructions, or any combination thereof for receiving, at a memory system, a request for information about a quantity of erase operations performed on a block of the memory system; determining the quantity of erase operations performed on the block based at least in part on the request; and transmitting, to a host system, an indication of the quantity of erase operations performed on the block based at least in part on determining the quantity of erase operations.

Aspect 12: The method, apparatus, or non-transitory computer-readable medium of aspect 11, further including operations, features, circuitry, logic, means, or instructions, or any combination thereof for performing an erase operation on the block of the memory system, where the quantity of erase operations is determined based at least in part on performing the erase operation.

Aspect 13: The method, apparatus, or non-transitory computer-readable medium of aspect 12, further including operations, features, circuitry, logic, means, or instructions, or any combination thereof for performing a data movement operation in which a set of data in the block is moved to a second block, where the erase operation is performed based at least in part on performing the data movement operation.

Aspect 14: The method, apparatus, or non-transitory computer-readable medium of any of aspects 12 through 13, further including operations, features, circuitry, logic, means, or instructions, or any combination thereof for incrementing a value of a counter associated with the block based at least in part on performing the erase operation, where the quantity of erase operations transmitted to the host system is based at least in part on the value of the counter.

Aspect 15: The method, apparatus, or non-transitory computer-readable medium of any of aspects 11 through 14, further including operations, features, circuitry, logic, means, or instructions, or any combination thereof for determining, after transmitting the indication of the quantity, a second quantity of erase operations performed on a second block and transmitting, from the memory system, an indication of the second quantity of erase operations performed on the second block.

Aspect 16: The method, apparatus, or non-transitory computer-readable medium of any of aspects 11 through 15, further including operations, features, circuitry, logic, means, or instructions, or any combination thereof for transmitting, based at least in part on the request, an indication of a total quantity of erase operations permitted for the block.

It should be noted that the described techniques include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 17: An apparatus, including: a memory system; and a controller coupled with the memory system and configured to cause the apparatus to: receive, at the memory system, a request for information about a quantity of erase operations performed on a block of the memory system; determine the quantity of erase operations performed on the block based at least in part on the request; and transmit, to a host system, an indication of the quantity of erase operations performed on the block based at least in part on determining the quantity of erase operations.

Aspect 18: The apparatus of aspect 17, where the controller is further configured to cause the apparatus to: perform an erase operation on the block of the memory system, where the quantity of erase operations is determined based at least in part on performing the erase operation.

Aspect 19: The apparatus of aspect 18, where the controller is further configured to cause the apparatus to: perform a data movement operation in which a set of data in the block is moved to a second block, where the erase operation is performed based at least in part on performing the data movement operation.

Aspect 20: The apparatus of any of aspects 18 through 19, where the controller is further configured to cause the apparatus to: increment a value of a counter associated with the block based at least in part on performing the erase operation, where the quantity of erase operations transmitted to the host system is based at least in part on the value of the counter.

Aspect 21: The apparatus of any of aspects 17 through 20, where the controller is further configured to cause the apparatus to: determine, after transmitting the indication of the quantity, a second quantity of erase operations performed on a second block; and transmit, from the memory system, an indication of the second quantity of erase operations performed on the second block.

Aspect 22: The apparatus of any of aspects 17 through 21, where the controller is further configured to cause the apparatus to: transmit, based at least in part on the request, an indication of a total quantity of erase operations permitted for the block.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   receiving, at a host system, an indication of a quantity of erase operations performed on a block of a memory system;
   determining a total quantity of erase operations permitted for the block;
   selecting a threshold quantity based at least in part on the total quantity of erase operations;
   comparing the quantity of erase operations performed on the block with the threshold quantity;
   determining a reliability status of the block based at least in part on comparing the quantity of erase operations performed on the block with the threshold quantity; and
   retiring the block based at least in part on the reliability status.

2. The method of claim 1, wherein determining the reliability status comprises:
   determining that the block is unreliable for storing information, and wherein retiring the block comprises:
   adding the block to a list of blocks avoided for access operations.

3. The method of claim 1, further comprising:
   transmitting, from the host system, a request for information about the quantity of erase operations performed on the block of the memory system, wherein the indication is received based at least in part on transmitting the request.

4. The method of claim 1, further comprising:
   determining that the quantity of erase operations performed on the block satisfies the threshold quantity, wherein determining the reliability status of the block comprises:
   determining that the block is unreliable for storing information, wherein the block is retired based at least in part on determining that the block is unreliable.

5. The method of claim 1, further comprising:
   determining a quantity of bits that memory cells included in the block are configured to store, wherein the threshold quantity is selected based at least in part on the quantity of bits.

6. A method, comprising:
   receiving, at a host system, an indication of a quantity of erase operations performed on a block of a memory system;
   comparing the quantity of erase operations performed on the block with a threshold quantity;
   determining a reliability status of the block based at least in part on comparing the quantity of erase operations performed on the block with the threshold quantity;
   retiring the block based at least in part on the reliability status;
   receiving an indication of a second quantity of erase operations performed on a second block of the memory system; and
   comparing the second quantity of erase operations performed on the second block with a second threshold quantity.

7. The method of claim 6, further comprising:
   determining a reliability status of the second block based at least in part on comparing the second quantity of erase operations performed on the second block with the second threshold quantity; and
   retiring the second block based at least in part on the reliability status of the second block.

8. The method of claim 6, wherein the threshold quantity is equal to the second threshold quantity.

9. The method of claim 6, further comprising:
   determining a first total quantity of erase operations permitted for the block and a second total quantity of erase operations permitted for the second block different than the first total quantity of erase operations; and
   selecting the threshold quantity for the block as the first total quantity and selecting the second threshold quantity for the second block as the second total quantity.

10. A method, comprising:
    receiving, at a memory system, a request for information about a quantity of erase operations performed on a block of the memory system;
    performing an erase operation on the block of the memory system based at least in part on performing a data movement operation in which a set of data in the block is moved to a second block;

determining the quantity of erase operations performed on the block based at least in part on the request and based at least in part on performing the erase operation; and transmitting, to a host system, an indication of the quantity of erase operations performed on the block based at least in part on determining the quantity of erase operations.

11. The method of claim 10, further comprising:

incrementing a value of a counter associated with the block based at least in part on performing the erase operation, wherein the quantity of erase operations transmitted to the host system is based at least in part on the value of the counter.

12. A method, comprising:

receiving, at a memory system, a request for information about a quantity of erase operations performed on a block of the memory system;

determining the quantity of erase operations performed on the block based at least in part on the request;

transmitting, to a host system, an indication of the quantity of erase operations performed on the block based at least in part on determining the quantity of erase operations;

determining, after transmitting the indication of the quantity, a second quantity of erase operations performed on a second block; and transmitting, from the memory system, an indication of the second quantity of erase operations performed on the second block.

13. The method of claim 10, further comprising:

transmitting, based at least in part on the request, an indication of a total quantity of erase operations permitted for the block.

14. An apparatus, comprising:

a memory system; and one or more controllers coupled with the memory system and configured to cause the apparatus to:

receive, at the memory system, a request for information about a quantity of erase operations performed on a block of the memory system;

perform an erase operation on the block of the memory system based at least in part on performing a data movement operation in which a set of data in the block is moved to a second block;

determine the quantity of erase operations performed on the block based at least in part on the request and based at least in part on performing the erase operation; and transmit, to a host system, an indication of the quantity of erase operations performed on the block based at least in part on determining the quantity of erase operations.

15. The apparatus of claim 14, wherein the one or more controllers is further configured to cause the apparatus to:

increment a value of a counter associated with the block based at least in part on performing the erase operation, wherein the quantity of erase operations transmitted to the host system is based at least in part on the value of the counter.

16. An apparatus, comprising:

a memory system; and one or more controllers coupled with the memory system and configured to cause the apparatus to:

receive, at the memory system, a request for information about a quantity of erase operations performed on a block of the memory system;

determine the quantity of erase operations performed on the block based at least in part on the request;

transmit, to a host system, an indication of the quantity of erase operations performed on the block based at least in part on determining the quantity of erase operations;

determine, after transmitting the indication of the quantity, a second quantity of erase operations performed on a second block; and transmit, from the memory system, an indication of the second quantity of erase operations performed on the second block.

17. The apparatus of claim 14, wherein the one or more controllers is further configured to cause the apparatus to:

transmit, based at least in part on the request, an indication of a total quantity of erase operations permitted for the block.

* * * * *